(12) United States Patent
Morita et al.

(10) Patent No.: US 8,017,246 B2
(45) Date of Patent: Sep. 13, 2011

(54) SILICONE RESIN FOR PROTECTING A LIGHT TRANSMITTING SURFACE OF AN OPTOELECTRONIC DEVICE

(75) Inventors: Yasumasa Morita, Sunnyvale, CA (US); Nicolaas Joseph Martin van Leth, Valkenswaard (NL); Cheun Jye Yow, Penang (MY); Wai Choo Chai, Penang (MY); Kinya Kodama, Gunma Pref. (JP); Tsutomu Kashiwagi, Gunma Pref. (JP); Toshio Shiobara, Gunma Pref. (JP)

(73) Assignees: Philips Lumileds Lighting Company, LLC, San Jose, CA (US); Shin-Etsu Chemical Co., Ltd., Tokyo (JP)

( * ) Notice: Subject to any disclaimer, the term of this patent is extended or adjusted under 35 U.S.C. 154(b) by 180 days.

(21) Appl. No.: 11/937,425

(22) Filed: Nov. 8, 2007

(65) Prior Publication Data

US 2009/0123764 A1    May 14, 2009

(51) Int. Cl.
*B32B 9/04*    (2006.01)
*C08G 77/12*    (2006.01)
*C08G 77/04*    (2006.01)
*B05D 5/06*    (2006.01)

(52) U.S. Cl. ............ 428/447; 528/31; 528/33; 427/162; 427/445

(58) Field of Classification Search .................. 423/342, 423/347–349; 528/31–36; 524/731; 428/446, 428/447; 427/162, 445
See application file for complete search history.

(56) References Cited

U.S. PATENT DOCUMENTS

| | | | | |
|---|---|---|---|---|
| 5,232,959 | A * | 8/1993 | Togashi et al. | 523/211 |
| 5,266,352 | A * | 11/1993 | Filas et al. | 427/163.2 |
| 2002/0158317 | A1* | 10/2002 | Becker et al. | 257/678 |
| 2004/0241927 | A1* | 12/2004 | Kato et al. | 438/202 |
| 2006/0073347 | A1 | 4/2006 | Morita et al. | |
| 2007/0216061 | A1* | 9/2007 | Karthauser et al. | 264/236 |

FOREIGN PATENT DOCUMENTS

JP    06037213    2/1994
JP    2005307015    11/2005

OTHER PUBLICATIONS

Urasaki et al. "Separation of Low Molecular Siloxanes for Electronic Application by Liquid-Liquid Extraction". IEEE Transactions on Electronics Packaging Manufacturing, vol. 22, No. 4, (Oct. 1999). pp. 295-298.*
Riegler et al. "Index Matching Silicone for High Brightness LED Packaging". NuSil Technology Whitepapers. Published online Mar. 18, 2005.*
European Search Report, 5 pages.

* cited by examiner

*Primary Examiner* — David R Sample
*Assistant Examiner* — Prashant J Khatri

(57) ABSTRACT

A silicone resin composition and process for coating a light transmitting surface of an optoelectronic device is disclosed. The process involves applying a silicone resin to the light transmitting surface, and causing the silicone resin to cure to form a light transmitting protective coating on the light transmitting surface, the silicone resin having a sufficiently low proportion of organosiloxanes having molecular weights of up to about 1000, such that the protective coating includes less than about 10% of the organosiloxanes having molecular weights of up to about 1000.

23 Claims, 3 Drawing Sheets

Table 1

| Example | 1 | 2 | 3 |
|---|---|---|---|
| SiH/SiVi | 1.5 | 1.2 | 0.7 |
| Curing conditions | 120°C/1 hr | 120°C/1 hr | 120°C/1 hr |
| Refractive index | 1.51 | 1.51 | 1.51 |
| Shore 00 hardness | 70 | 75 | 50 |
| Heat resistance test (260°C/3 min, 3 cycles) | no cracks | no cracks | no cracks |
| Thermal shock test (-40°C/120°C, 500 cycles) | no cracks | no cracks | no cracks |
| Emitted light intensity | 10% down after 2 hr | 10% down after 2 hr | 15% down after 2 hr |

Table 2

| Comparative Example | 1 | 2 | 3 |
|---|---|---|---|
| SiH/SiVi | 1.5 | 1.2 | 0.8 |
| Curing conditions | 120°C/1 hr | 120°C/1 hr | 120°C/1 hr |
| Refractive index | 1.51 | 1.51 | 1.51 |
| Shore 00 hardness | 40 | 45 | 30 |
| Heat resistance test (260°C/3 min, 3 cycles) | no cracks | no cracks | no cracks |
| Thermal shock test (-40°C/120°C, 500 cycles) | no cracks | no cracks | no cracks |
| Emitted light intensity | 70% down after 2 hr | 60% down after 2 hr | 80% down after 2 hr |

FIG. 4

SILICONE RESIN FOR PROTECTING A LIGHT TRANSMITTING SURFACE OF AN OPTOELECTRONIC DEVICE

BACKGROUND OF THE INVENTION

1. Field of Invention

This invention relates generally to optoelectronic devices and more particularly to protective coatings for optoelectronic devices such as light emitting diodes.

2. Description of Related Art

Optoelectronic devices such as light emitting diodes (LED's), laser diodes, and photo-detectors generally have light transmitting surfaces that are subject to contamination by contaminants present in the environment or in the packaging materials used to package the device. Such contamination may unacceptably degrade the performance of the optoelectronic device over time. Furthermore, semiconductor materials used to fabricate optoelectronic devices, and electrical connections to such devices are typically fragile and should be protected from mechanical shock to make the device structurally sound.

Accordingly, various materials are used to encapsulate optoelectronic devices to protect and isolate the device from environmental effects. Such materials may also be selected to enhance light transmission to or from the device.

Epoxy resins have traditionally been used to encapsulate high-intensity blue or white LED's emitting light in the near ultraviolet spectrum. However epoxy resins suffer from a problem of discoloration and this may result in the LED having a reduced operating lifetime.

Silicone resins have also been used for encapsulating LED's. However discoloration of the silicone resin may still occur even when using silicone resins that are resistant to elevated temperatures and resistant to degradation by the emitted light.

Accordingly there remains a need for improved protective coatings for optoelectronic devices.

SUMMARY OF THE INVENTION

In accordance with one aspect of the invention there is provided an optoelectronic device. The device includes a light transmitting surface, and a light transmitting protective coating of cured silicone resin on the light transmitting surface, the protective coating includes less than about 10% of organosiloxanes having molecular weights of up to about 1000.

The light transmitting surface may include a light emitting surface of a light emitting diode.

The device may include an overcoat layer on the protective coating, the overcoat layer being operable to seal the protective coating.

The protective coating may include cured silicone resin having a Shore 00 hardness of up to about 85.

The protective coating may include at least one of a phenyl and a cyclohexyl group in a proportion of at least about 10% by mole fraction, the at least one of the phenyl and the cyclohexyl group being operable to increase a refractive index of the protective coating.

The cured silicone resin has a refractive index of at least about 1.45.

The protective coating may include at least one of a phosphor material, an inorganic filler material, an adhesive aid for enhancing adhesion of the protective coating to the light transmitting surface, and an anti-oxidant operable to prevent discoloration of the protective coating.

The device may include an optical element spaced apart from the light transmitting surface, and the light protective coating may be disposed between the light transmitting surface and the optical element.

The protective coating may include less than about 8% of organosiloxanes having molecular weights of up to about 1000.

In accordance with another aspect of the invention there is provided a process for coating a light transmitting surface of an optoelectronic device. The process involves applying a silicone resin to the light transmitting surface, and causing the silicone resin to cure to form a light transmitting protective coating on the light transmitting surface, the silicone resin having a sufficiently low proportion of organosiloxanes having molecular weights of up to about 1000, such that the protective coating includes less than about 10% of the organosiloxanes having molecular weights of up to about 1000.

Applying the silicone resin composition may involve admixing a linear organopolysiloxane may involve at least one unsaturated aliphatic group participating in hydrosilylation reaction in a molecule, an organohydrogenpolysiloxane, and a platinum metal catalyst.

Admixing the organohydrogenpolysiloxane may involve admixing an organohydrogenpolysiloxane in sufficient proportion to cause the silicone resin composition to cure to form a protective coating having a Shore 00 hardness of up to about 85.

Admixing the linear organopolysiloxane may involve admixing a linear organopolysiloxane having a viscosity of about 0.3 to about 100 Pa-s at 23° C.

Admixing the linear organopolysiloxane may involve admixing a linear organopolysiloxane having at least one of a phenyl and a cyclohexyl group to increase a refractive index of the protective coating.

The linear organopolysiloxane may involve an organopolysiloxane having the general formula:

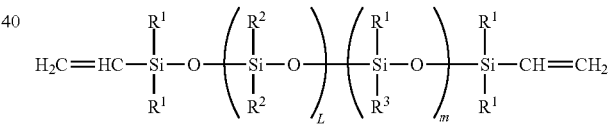

wherein $R^1$ are each independently a substituted or unsubstituted monovalent hydrocarbon group, $R^2$ are each independently a substituted or unsubstituted monovalent hydrocarbon group excluding phenyl and cyclohexyl groups; each $R^3$ are each independently a phenyl or cyclohexyl group, each of L and m is 0 or a positive integer, with the proviso that at least one $R^1$ is a phenyl or a cyclohexyl group when m=0, and the sum of L+m is such a number that the organopolysiloxane has a viscosity of about 0.3 to about 100 Pa-s at 23° C.

The process may involve removing at least a portion of organosiloxanes having low molecular weights from the linear organopolysiloxane prior to the admixing.

Removing may involve at least one of alcohol washing and heating the linear organopolysiloxane.

The process may involve admixing at least one of a phosphor material, an inorganic filler material, an adhesive aid for enhancing adhesion of the protective coating to the light transmitting surface, an anti-oxidant operable to prevent discoloration of the protective coating, and a cure inhibitor operable to inhibit curing of the silicone resin after the admixing.

The process may involve overcoating the protective coating with a sealing material.

Applying the silicone resin may involve applying a silicone resin having a sufficiently low proportion of organosiloxanes having molecular weights of up to about 1000, such that the protective coating may involve less than about 8% of the organosiloxanes having molecular weights of up to about 1000.

In accordance with another aspect of the invention there is provided a silicone resin composition for coating a light transmitting surface of an optoelectronic device. The composition a plurality of liquid components including a linear organopolysiloxane component includes at least one unsaturated aliphatic group participating in hydrosilylation reaction in a molecule, an organohydrogenpolysiloxane component, a platinum group metal catalyst, and the linear organopolysiloxane component having a sufficiently low proportion of organosiloxanes having molecular weights of up to about 1000, such that when the silicone resin product is cured the cured product includes less than about 10% of the organosiloxanes having molecular weights of up to about 1000.

The liquid components may be admixed with a cure inhibitor operable to inhibit curing of the silicone resin product prior to application on the light transmitting surface.

The liquid components may be provided separately for combination into the silicone resin composition immediately prior to application on the light transmitting surface.

The silicone resin composition may include at least one of a phosphor material, an inorganic filler material, an adhesive aid for enhancing adhesion of the cured product to the light transmitting surface, and an anti-oxidant operable to prevent discoloration of the cured product.

The linear organopolysiloxane component has a sufficiently low proportion of organosiloxanes having molecular weights of up to about 1000, such that when the silicone resin product may be cured the cured product may include less than about 8% of the organosiloxanes having molecular weights of up to about 1000.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

In drawings which illustrate embodiments of the invention,

FIG. 4 is a tabular view of results of tests performed in accordance with examples 1-3 (Table 1) and comparative examples 1-3 (Table 2).

DETAILED DESCRIPTION

Protective Coating

Figure 1:
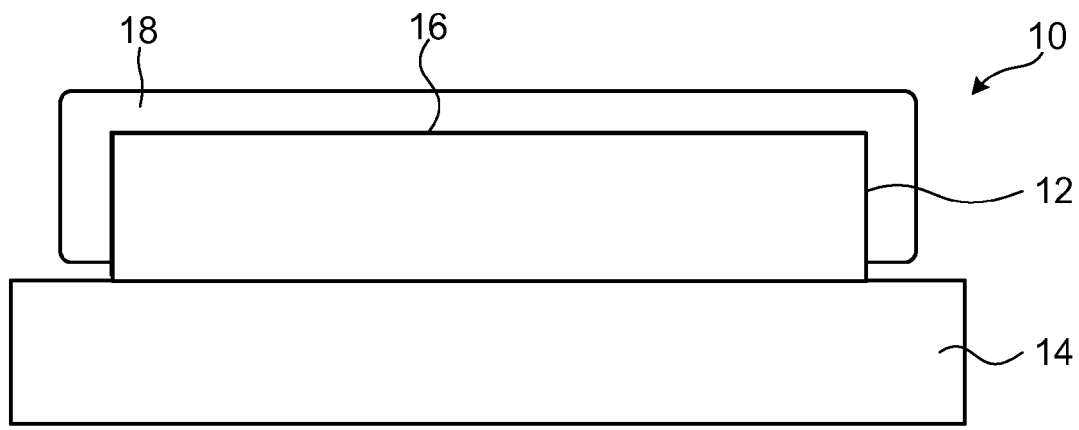
FIG. 1 is a schematic cross sectional view of an optoelectronic device in accordance with an embodiment of the invention.

Referring to FIG. 1, an optoelectronic device according to a first embodiment of the invention is shown generally at 10. The optoelectronic device 10 may be a light emitting diode, a laser diode, or a proto-detector, for example. The optoelectronic device 10 includes a semiconductor die 12 mounted on a support 14. The semiconductor die 12 has a light transmitting surface 16 through which light is either emitted or received. The optoelectronic device 10 also includes a light transmitting protective coating 18 of cured silicone resin on the light transmitting surface 16. The protective coating 18 comprises less than about 10% of organosiloxanes having molecular weights of up to about 1000.

The inventors have found that discoloration of the protective coating 18 is significantly reduced by reducing a low molecular weight silicone fraction in the cured silicone resin.

The inventors believe that discoloration of prior art silicone resins is not ascribable to the effects of light intensity and/or temperature since it has been observed by the inventors that once such a protective coating has become discolored, the discoloration may clear with lapse of time. However when using prior art silicone resins to form protective coatings, whether the discoloration reverses or not it is still a problem that the light transmittance through the coating may vary with time.

The inventors believe that contamination of the silicone resin protective coating occurs due to presence of organic contaminants, such as solder flux, in the optoelectronic device package. Attempts to remove and/or prevent ingress of such contaminants have not been successful, and it appears that even contaminants from outside the package may be transported to portions of the protective coating through which light is transmitted, thus causing reduction in light transmittance. Advantageously, reducing the proportion of low molecular weight silicones in the silicone resin is believed by the inventors to prevent transport of contaminants through the protective coating to portions of the protective coating through which light is transmitted.

Many optoelectronic devices are fabricated from high refractive index semiconductor materials (typically in the range 3.5-4.5). Coupling emitted light from such devices directly into air would result in back reflection of light at the device/air interface of approximately 30% for a device having a refractive index of 3.5. Inclusion of a silicone resin protective coating 18 having a refractive index of 1.5 reduces the total back reflection of light at the device/protective coating and protective coating/air interfaces to below 20%.

Figure 2:
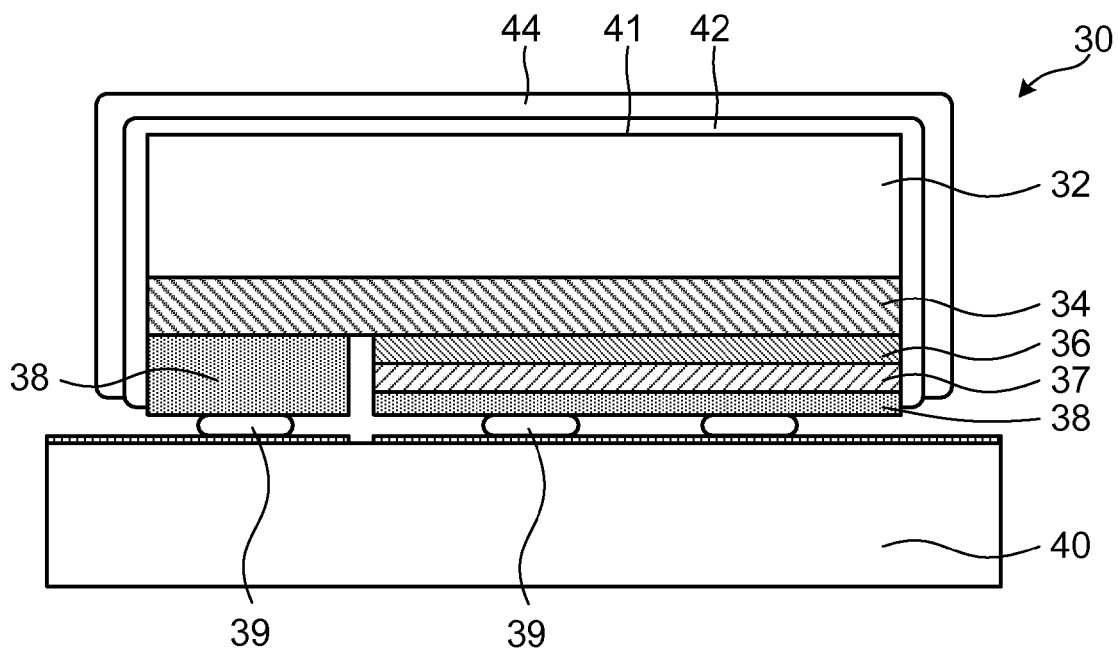
FIG. 2 is a schematic cross sectional view of a light emitting diode in accordance with an alternative embodiment of the invention.

Referring now to FIG. 2, an exemplary LED optoelectronic device is shown generally at 30. The LED 30 includes a substrate 32, an n-type region 34, an active region 36, and a p-type region 37. Each of n-type region 34, active region 36, and p-type region 37 may be a single layer or multiple layers with the same or different compositions, thicknesses, and dopant concentrations. A portion of the p-type region 37 and active region 36 is removed to expose a portion of n-type region 34. Contacts 38 are formed on the remaining portion of p-type region 37 and the exposed portion of n-type region 34. The contacts 38 may be electrically and physically connected to a support 40 by interconnects 39, which may be solder, for example. The contacts 38 may be reflective, such that light generated in active region 36 is extracted from the LED through substrate 32. In operation the LED 30 receives an electrical current through the contacts 38, and light in a first wavelength range is generated in the active region 36. The generated light is emitted through a light transmitting surface 41.

In this embodiment the LED 30 includes a wavelength-converting layer 42, which is formed over the LED. The wavelength-converting layer 42 receives at least some of the light emitted at the light transmitting surface 41, which has a wavelength in the first wavelength range, and generates light in a second wavelength range. In one embodiment the wavelength-converting layer may emit light having wavelengths generally conforming to a white light spectrum. The wavelength-converting layer 42 may include a material such as phosphor.

The LED 30 also includes a silicone resin protective coating 44, which is formed over the wavelength-converting layer 42. The protective coating 44 comprises less than about 10% of organosiloxanes having molecular weights of up to about 1000. In this embodiment the protective coating 44 also has a Shore 00 hardness of up to 85 and refractive index of at least about 1.45.

LED devices are typically grown on a substrate such as sapphire, which has a refractive index of about 1.8. Inclusion of a silicone resin protective coating 44 having a refractive index of 1.5 reduces the total back reflection of light at the device/protective coating and protective coating/air interfaces from about 8% to about 5%.

In some embodiments, the protective coating 44 may include wavelength-converting phosphors in addition to, or instead of the wavelength-converting layer 42. The protective coating 44 may also include a filler material, an adhesive aid for enhancing adhesion to the light transmitting surface 41 (or wavelength converting layer 42, if present), and/or an antioxidant operable to prevent discoloration of the protective coating.

Figure 3:
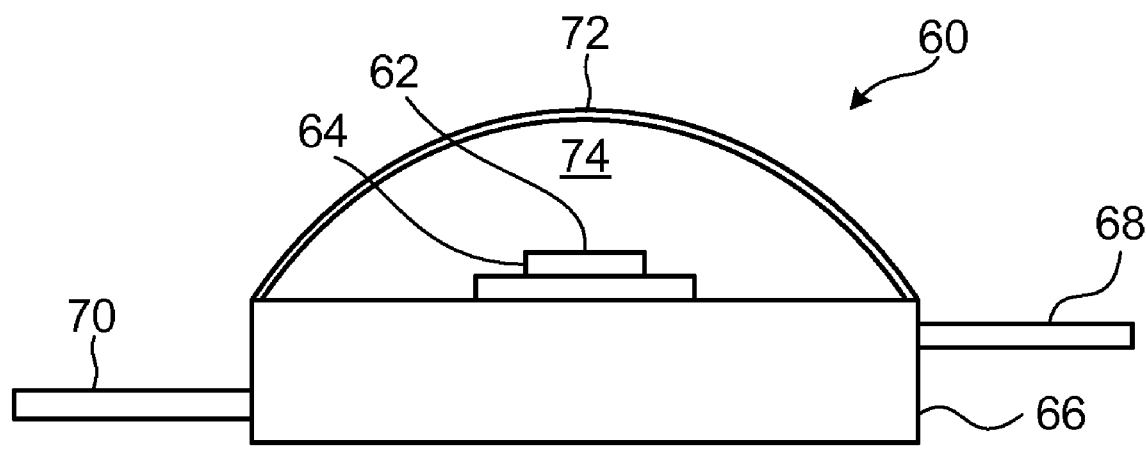
FIG. 3 is a schematic cross sectional view of a light emitting diode in accordance with another alternative embodiment of the invention.

Referring to FIG. 3, an alternative LED embodiment is shown generally at 60. The LED 60 includes an LED die 62, which is mounted on a substrate 64. The substrate 64 is in turn mounted on a support frame 66. The support frame 66 includes first and second electrical contacts 68 and 70, which are connected to the LED die 62 for supplying an electrical current to the LED die. The LED 60 also includes a lens element 72, which is supported on the support frame 66, and defines a cavity 74 between the LED die 62 and the lens element 72. The lens element 72 is operable to collect and/or direct the light emitted by the LED 60.

In this embodiment the cavity 74 is filled with a silicone resin composition, which is cured in place to form a protective coating encapsulating the LED die 62. A material of the lens element 72 may be selected to have a refractive index value in-between the refractive index of the cured silicone resin and the refractive index of air, so as to further reduce the back reflected light at the various interfaces between materials through which the light is transmitted.

Alternatively, the lens element 72 may be substituted by an optical element such as a window, or a filter, for example.

Applying the Protective Coating

The silicone resin may be provided as a plurality of liquid components A, B and C. In this embodiment component A includes a linear organopolysiloxane comprising at least one unsaturated aliphatic group participating in hydrosilylation reaction in a molecule. Component B includes a cross-linking agent for cross-linking component A such as an organohydrogenpolysiloxane. Component C includes a platinum metal catalyst. The components A, B and C may be mixed immediately prior to application to prepare a liquid silicone resin composition for application to the light transmitting surface 41. Alternatively, component A and C may be pre-mixed and then the combined component A and C may be mixed with component B immediately prior to application.

Depending on a particular application, the silicone resin composition may be coated on the light transmitting surface 41 by injecting, molding, spin coating, or casting. The silicone resin composition is then cured in place by passage of time and/or heating. In one embodiment the silicone resin composition is cured at about 25° C., while in other embodiments the cure temperature may be the range of 40° C. to 200° C., for example.

Advantageously, in embodiments where it is desired to protect an LED die, the silicone resin components may be selected such that the silicone resin composition cures into a protective coating having a Shore 00 hardness of up to about 85. In other embodiments the Shore 00 hardness of the cured protect may be in the range of about 20 to about 80, or in the range of about 30 to about 75. A cured hardness in excess of the aforementioned ranges may interfere with stress relaxation of the protective coating 44, which may lead to cracking of the cured silicone resin and/or damage to the underlying LED.

In some embodiments, the silicone resin may remain slightly tacky once cured, and in such embodiments the protective coating may be further overcoated with a layer for sealing the protective coating. In the embodiment shown in FIG. 3, the protective coating fills the cavity 74 and thus the lens 72 acts as a sealing element for the cured silicone resin.

The protective coating 44 may be applied to the LED by placing a retaining mold around the light transmitting surface 41 and filling the retaining mold with admixed components A, B and C. Alternatively, the protective coating 44 may be applied by casting, spin coating, or injection techniques.

In other embodiments the components A, B and C may be admixed with a cure inhibitor such as acetylene alcohol and stored as a single component silicone resin composition in a hermetically sealed container. Such a single component silicone resin composition, when applied to an optoelectronic device, cures to form a protective coating as the cure inhibitor evaporates on exposure to air.

Silicone Resin Composition

Component A

Component (A) is an organopolysiloxane base component of the silicone resin composition. Specifically it is a linear organopolysiloxane having at least one unsaturated aliphatic group (typically an alkenyl group such as vinyl and allyl) bonded to a silicon atom in a molecule, having a phenyl and/or cyclohexyl group and having a viscosity of about 0.3 to about 100 Pa-s at 23° C.

The term 'aliphatic' as used herein refers to organic moieties, substituents and/or compounds that are not aromatic, or in other words, non-aromatic moieties, substituents and/or compounds. In some embodiments, the aliphatic moiety may be a moiety that is acyclic while in other embodiments, the aliphatic moiety may be a branched-linear or an unbranched moiety. In still other embodiments, the aliphatic moiety may comprise a silicon and/or other heteroatoms as well as carbon atoms.

The organopolysiloxane may comprise a low-molecular-weight fraction (low-molecular-weight organosiloxane fraction) which has a (weight average) molecular weight of up to about 1,000 as measured by gel permeation chromatography (GPC) versus polystyrene standards in a proportion of less than about 10% based on the organopolysiloxane.

In some illustrative embodiments, the organopolysiloxane may have a backbone comprising recurring silicon atoms bonded to oxygen atoms. The backbone may be recurring diorganosiloxanes, which diorganosiloxanes may independently be the same or different, and may have a triorganosiloxy group at least one end of the molecule. Often a triorganosiloxy group is a terminal group bonded to a diorganosilxane via an oxygen atom. The organo groups of the molecule may independently be the same or different. At least one of the organo groups is phenyl or cyclohexyl and the remaining organo groups may also be substituted or unsubstituted monovalent hydrocarbons. In some cases the hydrocarbons may comprise a heteroatom. Such organopolysiloxanes may be used alone or in admixture as component A In one illustrative embodiment, component A may have a viscosity at 23° C. of about 0.3 to about 100 Pa-s. In another embodiment component A may have a viscosity at 23° C. of about 0.5 to about 50 Pa-s, or about 0.5 to about 10 Pa-s. If the viscosity of component A is too low, indicating that the base component has a shorter chain length, then crack resistance of the cured silicone resin may be compromised. If the viscosity of component A is too high, then the silicone resin composition becomes awkward to handle and apply to the light transmitting surface.

The unsaturated aliphatic group bonded to a silicon atom in component A may be bonded to a silicon atom at an end of the molecule or a silicon atom at a non-end (or intermediate) position of the molecule, or in both positions. In some illustrative embodiments, organopolysiloxanes having unsaturated aliphatic groups bonded to silicon atoms at both ends of the molecule are provided. In one embodiment, the content of unsaturated aliphatic groups may be about 0.001 to about 20 mol % based on the silicon atoms in the molecule. In other embodiments the content of unsaturated aliphatic groups may be about 0.005 to about 10 mol % based on the silicon atoms in the molecule.

As described above, the organopolysiloxane of component A comprises a phenyl group or cyclohexyl group or both, which are effective in increasing the refractive index of the cured silicone resin protective coating. In one embodiment, the proportion of phenyl and cyclohexyl groups is about 10 to 50 mol %, or about 20 to about 40 mol %, based on the entire silicon-bonded substituent groups (i.e., the total of substituted or unsubstituted monovalent hydrocarbon groups bonded to silicon atoms) and the refractive index of the resulting cured silicone protective coating is at least about 1.45.

The preferred organopolysiloxane of component A is an organopolysiloxane of the general formula:

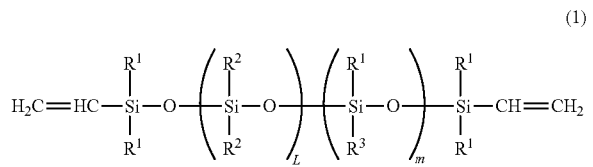

(1)

wherein $R^1$ are each independently a substituted or unsubstituted monovalent hydrocarbon group, $R^2$ are each independently a substituted or unsubstituted monovalent hydrocarbon group excluding phenyl and cyclohexyl groups; each $R^3$ are each independently a phenyl or cyclohexyl group, each of L and m is 0 or a positive integer, with the proviso that at least one $R^1$ is a phenyl or a cyclohexyl group when m=0, and the sum of L+m is such a number that the organopolysiloxane has a viscosity of about 0.3 to about 100 Pa-s at 23° C.

In formula (1) above, examples of the monovalent hydrocarbon groups represented by $R^1$ include, but are not limited to, lower alkyl groups such as methyl, ethyl, propyl, and butyl; cycloalkyl groups such as cyclohexyl; alkenyl groups such as vinyl and allyl; aryl groups such as phenyl, tolyl and xylyl; aralkyl groups such as benzyl; and substituted forms of the foregoing groups in which some or all hydrogen atoms are substituted by halogen atoms, cyano groups or the like, such as chloromethyl, cyanoethyl, and 3,3,3-trifluoropropyl. In some illustrative embodiments, each monovalent hydrocarbon group may independently have 1, 2, 3, 4, 5, 6, 7, 8, 9, 10 or more carbon atoms. In some illustrative embodiments each monovalent hydrocarbon may independently have 1 to 10 carbon atoms, or 1 to 6 carbon atoms.

Examples of the monovalent hydrocarbon groups represented by $R^2$ include lower alkyl groups such as methyl, ethyl, propyl, and butyl; cycloalkyl groups exclusive of cyclohexyl, such as cyclopentyl; alkenyl groups such as vinyl and allyl; aryl groups exclusive of phenyl, such as tolyl and xylyl; aralkyl groups such as benzyl; and substituted forms of the foregoing groups in which some or all hydrogen atoms are substituted by halogen atoms, cyano groups or the like, such as chloromethyl, cyanoethyl, and 3,3,3-trifluoropropyl. In some illustrative embodiments, each monovalent hydrocarbon group may independently have 1, 2, 3, 4, 5, 6, 7, 8, 9, 10 or more carbon atoms. In some illustrative embodiments each monovalent hydrocarbon may independently have 1 to 10 carbon atoms, or 1 to 6 carbon atoms.

Each of L and m is 0 or a positive integer, and in some illustrative embodiments, such a number that the organopolysiloxane has a viscosity at 23° C. in the above-specified range. L and m may be integers satisfying $0<L+m\leq1,000$, or $8\leq L+m\leq500$, or $18\leq L+m\leq200$. L may additionally satisfy $0<m/(L+m)\leq1$, or $0.05\leq m/(L+m)\leq0.8$, or $0.1\leq m/(L+m)\leq0.4$. It is noted that at least one $R^1$ is a phenyl or cyclohexyl group when m=0.

Illustrative examples of the organopolysiloxane of component A are given below, but are not limited thereto.

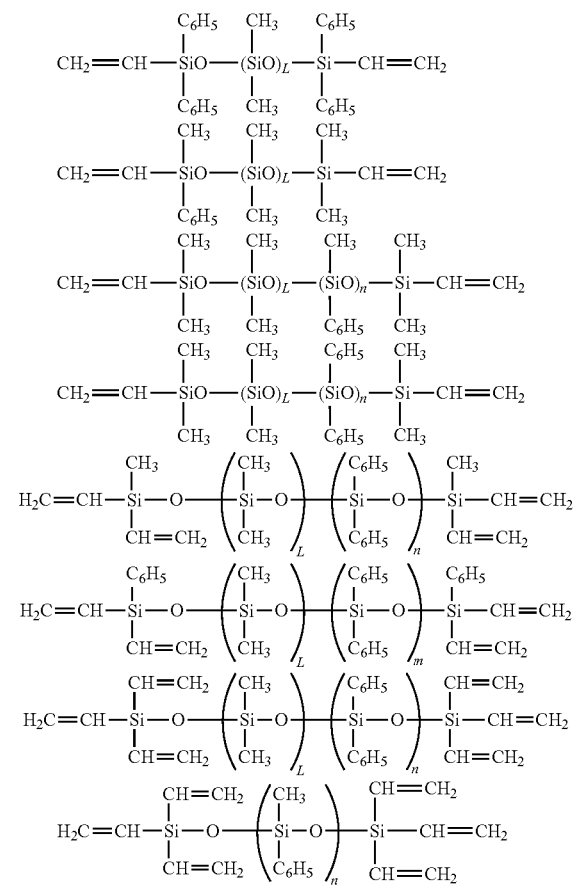

In the above formulae, L and m are as defined above, and n is a positive integer as defined for m, except that n satisfies $0<n/(L+n)\leq1$. Also included in examples of component A are those organopolysiloxanes of the above formulae wherein the phenyl moiety ($C_6H_5$) is replaced by a cyclohexyl moiety.

The organopolysiloxane of component A may be synthesized by processes known to persons of skill in the art. For example, the organopolysiloxane may be synthesized by an equilibration polymerization process using alkali.

During the synthesis processes, low-molecular-weight compounds (mainly cyclics) form due to the attained equilibrium with respect to the reactants, products and by-products. This low-molecular-weight fraction may be at least partially removed by techniques known to persons of skill in the art such as heat treatment and alcohol washing as described in the Examples appended hereto. By removing the low-molecular-weight fraction, especially non-functional low-molecular-weight organosiloxane fraction, a silicone resin composition is produced, which cures to form a protective coating that is resistant to discoloration and has improved thermal shock resistance. As used herein, the term "non-functional" refers to the absence of functional groups participating in the hydrosilylation reaction between the components A and B.

Exemplary low-molecular-weight compounds are cyclic and chain-like organosiloxane oligomers having the following formulae:

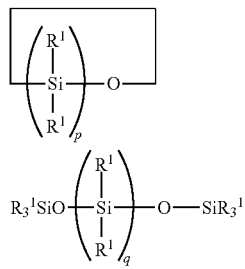

wherein $R^1$ is as defined above, p is an integer of 3 to 10, and q is an integer of 0 to 8. $R^1$ may be a methyl, phenyl or cyclohexyl group. More illustrative examples include cyclic dimethylsiloxane, diphenylsiloxane, and methylphenylsiloxane wherein p is 3 to 10 in one embodiment, and in other embodiments may be 3 to 8. Also included are trimethylsilyl end-blocked chain-like dimethylsiloxane oligomers, diphenyldimethylsiloxane oligomers, and methylphenylsiloxane oligomers wherein q is 0 to 8. Notably, it is estimated that trimethylsilyl end-blocked chain-like siloxane oligomers are substantially absent in the system wherein component A has vinyl groups only at both ends.

In the organopolysiloxane of component A, a content of a low-molecular-weight fraction which has a molecular weight of up to 1,000 as measured by GPC versus polystyrene standards may in one embodiment be less than 10% (i.e., 0 to 10%), or may in another embodiment be less than 8% (i.e., 0 to 8%), based on the type of organopolysiloxane. As used in the context relating to the content of low-molecular-weight fraction, the term "%" refers to "% by weight" as actually measured by a balance or the like when used for the cured product, and "% by weight" as measured by GPC or "% by area" based on a peak area ratio as measured by GPC when used for the composition prior to curing.

Component B

Component B is an organohydrogenpolysiloxane, which serves as a crosslinking agent for Component A. The organohydrogenpolysiloxane contains silicon-bonded hydrogen atoms (SiH groups) in a molecule. Silicone resins described herein cure in such a way that an addition reaction occurs between SiH groups in component B and silicon-bonded unsaturated aliphatic groups (typically alkenyl groups, e.g., vinyl and allyl) in component A. The molecular structure of the organohydrogenpolysiloxane may be a linear, branched, cyclic, partially branched cyclic or network structure. The position of SiH groups is not limited. When component B has a molecular chain end portion, SiH groups may be positioned at either one of a molecular chain end portion and a molecular chain non-end portion, or both. Individual compounds the may be used as component B may be used alone or in admixture of two or more such compounds.

Component B may be an organohydrogenpolysiloxane having an average compositional formula (2):

$$H_c(R^5)_d SiO_{(4-c-d)/2} \qquad (2)$$

wherein each $R^5$ is independently a substituted or unsubstituted monovalent hydrocarbon group free of unsaturated aliphatic; c and d are numbers satisfying $0.001 \leq c < 2$, $0.7 \leq d \leq 2$, and $0.8 \leq c+d \leq 3$, the organohydrogenpolysiloxane comprising at least two, and in some embodiments at least three, SiH groups on the molecule. Organohydrogenpolysiloxanes for use as or in component B may comprise 2 to 300, 3 to 200, or 4 to 100 SiH groups.

In formula (2), each $R^5$ may be the same or different and may independently be a substituted or unsubstituted monovalent hydrocarbon groups free of unsaturated aliphatic, having 1, 2, 3, 4, 5, 6, 7, 8, 9 or 10 carbon atoms. In some illustrative embodiments, each $R^9$ may independently have 1 to 10 carbon atoms, or 1 to 7 carbon atoms. Specific examples are those exemplified for $R^2$ in formula (1), exclusive of alkenyl groups, for example, lower alkyl groups such as methyl and aryl groups such as phenyl.

In formula (2), c and d are numbers satisfying in one embodiment, $0.001 \leq c < 2$, $0.7 \leq d \leq 2$, and $0.8 \leq c+d \leq 3$, and in another embodiment $0.05 \leq c \leq 1$, $0.8 \leq d \leq 2$, and $1 \leq c+d \leq 2.7$. The number of silicon atoms in the organohydrogenpolysiloxane may be 2 to 300, 3 to 200, or 4 to 100.

Examples of the organohydrogenpolysiloxane B include, but are not limited to:
pentamethyltrihydrogencyclotetrasiloxane,
1,3-dihydrogen-1,1,3,3 tetramethyldisiloxane
1,3,5,7-tetrahydrogen-1,3,5,7-tetramethylcyclotetrasiloxane,
tris(hydrogendimethylsiloxy)methylsilane,
tris(hydrogendimethylsiloxy)phenylsilane,
methylhydrogencyclopolysiloxane,
methylhydrogensiloxane-dimethylsiloxane cyclic copolymers,
trimethylsiloxy end-capped methylhydrogenpolysiloxane,
trimethylsiloxy end-capped dimethylsiloxane-methylhydrogensiloxane copolymers,
dimethylhydrogensiloxy end-capped dimethylpolysiloxane,
dimethylhydrogensiloxy end-capped dimethylsiloxane-methylhydrogensiloxane copolymers,
trimethylsiloxy end-capped methylhydrogensiloxane-diphenylsiloxane copolymers,
trimethylsiloxy end-capped methylhydrogensiloxane-diphenylsiloxane-dimethylsiloxane copolymers,
trimethylsiloxy end-capped methylhydrogensiloxane-methylphenylsiloxane-dimethylsiloxane copolymers,
dimethylhydrogensiloxy end-capped methylhydrogensiloxane-dimethylsiloxane-diphenylsiloxane copolymers,
dimethylhydrogensiloxy end-capped methylhydrogensiloxane-dimethylsiloxane-methylphenylsiloxane copolymers,
copolymers comprising or consisting of $(CH_3)_2HSiO_{1/2}$ units, $(CH_3)_3SiO_{1/2}$ units and $SiO_{4/2}$ units, copolymers comprising or consisting of $(CH_3)_2HSiO_{1/2}$ units and $SiO_{4/2}$ units, copolymers comprising or consisting of $(CH_3)_2HSiO_{1/2}$ units, $SiO_{4/2}$ units and $(C_6H_5)_3SiO_{1/2}$ units. The term "end-capped" as used herein means that a siloxane is capped with a specified group at each end of its molecular chain.

Component B may be obtained through hydrolysis of chlorosilanes such as $R^5SiHCl_2$, $(R^5)_3SiCl$, $(R^5)_2SiCl_2$, and $(R^5)_2SiHCl$ wherein $R^5$ is as defined above, or equilibration of siloxanes resulting from hydrolysis.

Component B may be used in an effective amount for the silicone resins described herein to cure in one embodiment and may be in an amount that the amount of SiH groups in component B is 0.1 to 4.0 moles, or in another embodiment 0.3 to 3.0 moles, or in yet another embodiment 0.6 to 2.0 moles per mole of the total of silicon-bonded unsaturated aliphatic groups in a composition comprising a mixture of components A and B, (i.e. including the silicon-bonded unsaturated aliphatic groups in component A). When component B is admixed with component A in such amounts, a curing reaction proceeds to a fuller extent thereby forming a cured silicone resin from silicone resins described herein, and thereby providing a reduced amount of unreacted SiH groups left in the cured product. Reducing the amount of unreacted SiH groups in the cured produce reduces the likelihood or the amount that rubber physical properties change over time.

Component C

Component C is a platinum metal catalyst which is compounded for causing addition curing reaction to the inventive composition. The catalyst may be an individual platinum metal catalyst or an admixture of different platinum metal catalysts. Exemplary catalysts include, but are not limited to: platinum, palladium and rhodium. Platinum-based catalysts may include, for example, $K_2PtCl_6$, $KHPtCl_6 \cdot kH_2O$, $K_2PtCl_4$, $K_2PtCl_4 \cdot kH_2O$, $PtO_2 \cdot kH_2O$, $PtCl_4 \cdot kH_2O$, $PtCl_2$, and $H_2PtCl_4 \cdot kH_2O$ wherein k is a positive integer, and complexes thereof with hydrocarbons, alcohols and vinyl-comprising organopolysiloxanes.

The amount of component C used may be a catalytic amount and may be such that about 0.1 to about 500 ppm of platinum metal is available, based on the total weight of components A, B and C. In another embodiment the amount of component C may be such that, about 0.5 to about 200 ppm of platinum metal is available.

Other Components

Various additives may be included in the silicone resin composition to further enhance the properties of the cured silicone resin protective coating. Such additives may be admixed as additional components or may be admixed with one of the components A, B or C as appropriate. In general, the inorganic fillers shown below may be mixed with any of the component A, B, or C. However, mixing Si—H containing organohydrogen polysiloxane (component B) with Platinum catalysis (component C) may cause dehydrogen reaction. Generally either component B or component C may be mixed with component A, before component B is mixed with component C.

For example, in the white light LED 30 shown in FIG. 2, various phosphors, reinforcing inorganic fillers such as fumed silica and fumed titanium dioxide, and non-reinforcing inorganic fillers such as calcium carbonate, calcium silicate, titanium dioxide, ferric oxide, carbon black, and zinc oxide may be compounded in an amount of up to 600 parts by weight per 100 parts by weight of components A to C combined. Specifically, in various embodiments the amount of these may be in the range of 1 to 600 parts, 5 to 400 parts, or 5 to 100 parts by weight per 100 parts by weight of components A to C combined.

In some embodiments, an adhesive aid may be optionally added to the silicone resin composition for improving its adhesion to the light transmitting surface 41. Improved adhesion may result in improved resistance to delamination of the protective coating 44 from the LED 30.

Suitable adhesive aids include organosilicon compounds such as organosilanes and organopolysiloxanes having silicon atom-bonded alkoxy groups. Examples of the organosilicon compounds include alkoxysilanes such as: tetramethoxysilane, tetraethoxysilane, dimethyldimethoxysilane, methylphenyldimethoxysilane, methylphenyldiethoxysilane, phenyltrimethoxysilane, methyltrimethoxysilane, methyltriethoxysilane, vinyltrimethoxysilane, allyltrimethoxysilane, allyltriethoxysilane, 3-glycidoxypropyltrimethoxysilane, and 3-methacryloxypropyltrimethoxysilane as well as siloxane compounds of linear chain or cyclic structure (i.e., organosiloxane oligomers) having about 4 to about 30 silicon atoms in one embodiment, or about 4 to about 20 silicon atoms in another embodiment and comprising a molecule at least two, or three functional groups selected from among silicon atom-bonded hydrogen atoms (SiH groups), silicon atom-bonded alkenyl groups (e.g., Si—CH=$CH_2$ groups), alkoxysilyl groups (e.g., trialkoxysilyl groups such as trimethoxysilyl), and epoxy groups (e.g., glycidoxypropyl and 3,4-epoxycyclohexylethyl).

In one embodiment, organoxysilyl-modified isocyanurate compounds having the general formula (3) and/or hydrolytic condensates thereof (i.e., organosiloxane-modified isocyanurate compounds) are used as the adhesive aid.

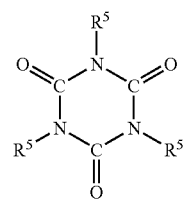

(3)

wherein $R^5$ is each independently a silicon atom-comprising organic group (or organoxysilylalkyl group) having the formula (4):

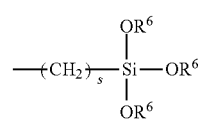

(4)

or a monovalent hydrocarbon group comprising an aliphatic unsaturated bond, at least one $R^5$ is a silicon atom-organic group of formula (4), $R^6$ is each independently hydrogen or a monovalent hydrocarbon group of 1 to 6 carbon atoms, and s is an integer of 1 to 6, or 1 to 4.

Examples of the monovalent hydrocarbon group comprising an aliphatic unsaturated bond, represented by $R^5$, include alkenyl groups of 2 to 8 carbon atoms in one embodiment, or 2 to 6 carbon atoms in another embodiment, such as vinyl, allyl, propenyl, isopropenyl, butenyl, isobutenyl, pentenyl, hexenyl, and cyclohexenyl. The monovalent hydrocarbon groups represented by $R^6$ include those of 1 to 8 carbon atoms in one embodiment, or 1 to 6 carbon atoms in another embodiment, for example, alkyl groups such as methyl, ethyl, propyl, isopropyl, butyl, isobutyl, tert-butyl, pentyl, and hexyl, cycloalkyl groups such as cyclohexyl, alkenyl groups such as vinyl, allyl, propenyl and isopropenyl, and aryl groups such as phenyl.

illustrative examples of the adhesive aid are provided below:

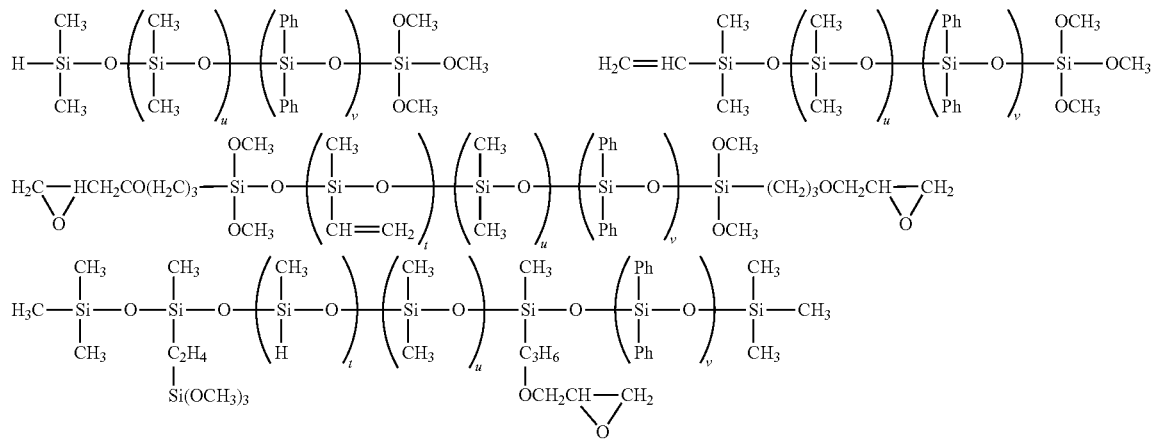

In the above examples, subscripts t and u are integers of at least 1, in various embodiments satisfying u+v=2 to 10, u+v=2 to 50, t+u+v=2 to 50, or t+u+v=4 to 20.

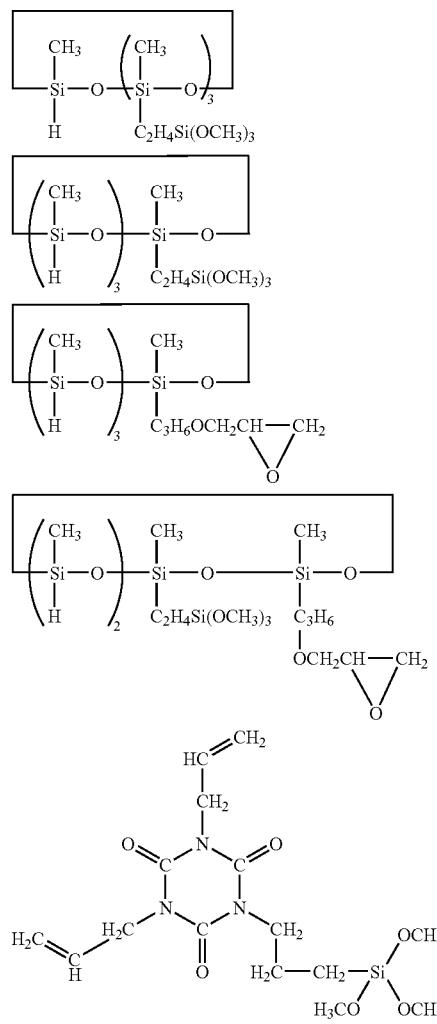

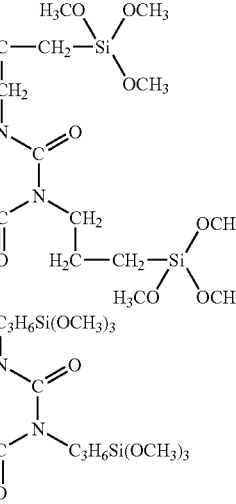

Of the organosilicon compounds, those organosilicon compounds having silicon atom-bonded alkoxy groups and silicon atom-bonded alkenyl groups or silicon atom-bonded hydrogen atoms (i.e., SiH groups) in a molecule may be preferred because the cured compositions may be more adhesive.

The optional adhesive aid may be included in an amount of up to about 10 parts by weight in one embodiment, or about 0.1 to 10 parts by weight in another embodiment, or about 0.1 to 5 parts by weight in yet another embodiment, per 100 parts by the combined weight of components A, B and C combined. If the adhesive proportion in the silicone resin composition is too high, this may adversely affect hardness, tack, and transparency of the cured silicone resin protective coating.

In another embodiment, an antioxidant such as 2,6-dibutyl-p-hydroxytoluene (BHT) and 2,2,4,4-tetramethyl-21-oxo-7-oxa-3.20-diazadispiro[5.1.11.2]-heneicosane-20-propanoicaciddodecylester/tetradecylester (Hostavin N24), discoloration preventive agents such as organophosphorus agents, photo-degradation preventive agents such as hindered amines, and colorants may be added in suitable proportions to limit the degradation and yet maintaining the physical and optical properties of the cured protective coating.

EXAMPLES

Examples of the silicone resin compositions are given below by way of illustration and not by way of limitation. All parts are by weight.

In the examples, unless stated otherwise the viscosity is measured at 23° C. by a Brookfield viscometer, the refractive index is measured on an uncured composition at 25° C. by an Abbe refractometer, and the hardness of the cured silicone resin is measured by molding and curing a composition at 120° C. for one hour into a cured specimen of 4 cm diameter and 8 mm thickness and measuring by a durometer type Shore 00.

In the following examples, a LED having a main emission peak at 450 nm was fabricated in a semiconductor package of the structure as generally shown in FIG. 2.

The low molecular weight proportion of the cured silicone resin was measured by curing the silicone resin composition by heating at 120° C. for one hour. A 1.0 g sample of the cured silicone resin was immersed in 25 ml of acetone and shaken at room temperature for 3 hours. After shaking the acetone solution, the remaining solids were separated from the solution by filtration, and the acetone was removed from the solution, whereby the acetone-soluble substances were recovered and weighed. The acetone-soluble substances were then analyzed by gel permeation chromatography (GPC). From the GPC chromatogram, peak area ratios of a silicone fraction having a molecular weight of up to 1,000 (low-molecular-weight silicone fraction) and a silicone fraction having a molecular weight in excess of 1,000, calculated versus polystyrene standards, were determined. A proportion (% by weight) of the low-molecular-weight silicone fraction was calculated according to the following equation:

wt % of silicone fraction having Mw≦1,000=
[weight (g) of acetone-soluble matter]×[peak area ratio (%) of silicone fraction having Mw≦1,000]/1.0 (g)　　　Eqn 1

In the following examples, a heat resistance test was performed by passing the sample through a reflow furnace having a peak temperature of 260° C. for about 3 minutes and holding the sample at room temperature (25° C.) for 10 seconds was repeated three times. It was observed whether or not cracks occurred.

A thermal shock test was also performed in each example by cooling the samples to a temperature of −40° C. for 30 minutes and then heating the samples to 120° C. for 30 over 500 cycles. It was observed whether or not cracks occurred.

In the following examples, an LED emitted light intensity test was performed out by supplying a 1.0 A current to the LED in a 150° C. environment. The emitted light intensity was measured at the start, and after 2 hours of the test for the calculation of the intensity drop percentage.

The results of these tests for each of the following examples are shown in Table 1 of FIG. 4 for silicone resin compositions in accordance with the invention. Results for comparative examples are shown in Table 2 of FIG. 4.

Example 1

A silicone resin composition was prepared by combining (a) 100 parts of an organopolysiloxane having the formula:

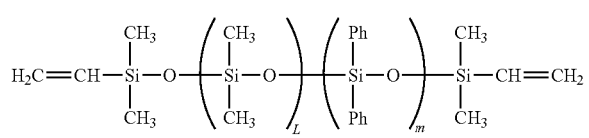

wherein L=70 and m=30, and having a viscosity of 4 Pa-s, from which a low-molecular-weight fraction had been removed by alcohol washing, (b) an organohydrogenpolysiloxane having the formula:

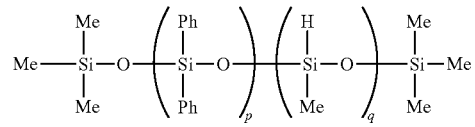

wherein p=1 and q=4, in such an amount as to give 1.5 moles of SiH groups per mole of total silicon-bonded vinyl groups in component (a), and (c) 0.05 part of an octyl alcohol-modified solution of chloroplatinic acid (platinum concentration 2 wt %), and thoroughly mixed. Note that the ratio of SiH groups to vinyl groups is abbreviated as SiH/SiVi in Tables 1 and 2 of FIG. 4.

The organopolysiloxane with a low-molecular-weight fraction removal was obtained by repeating the alcohol washing procedure involving adding an alcohol, typically methanol to (original) vinylphenylmethylpolysiloxane, mixing at 25° C. for one hour, and decanting off the alcohol. For this organopolysiloxane with a low-molecular-weight fraction removed, the content of a low-molecular-weight silicone fraction having a molecular weight of up to about 1,000 as measured by GPC versus polystyrene standards was 6% by weight.

The silicone resin composition had a refractive index of 1.51 as measured at a 592 nm wavelength. There was no change in refractive index before and after curing. The cured product had a Shore 00 hardness of 70. When 1.0 g of the cured product was immersed in acetone, 0.172 g of acetone-soluble substances were obtained. The extract was analyzed by GPC. A proportion (GPC peak area ratio) of an extract having a molecular weight of up to 1,000 (low-molecular-weight silicone fraction) was 35%. Accordingly, the content of silicone fraction having a molecular weight of up to 1,000 in the cured product was calculated using Eqn 1 above to be 6.0% by weight.

The silicone resin composition was applied by casting to a light-emitting semiconductor device (sample) as shown in FIG. 2. The composition was cured by heating at 120° C. for one hour and then subjected to the above heat resistance test, thermal shock test, and emitted light intensity test.

Example 2

A silicone resin composition was prepared by combining (a) 100 parts of an organopolysiloxane having the formula:

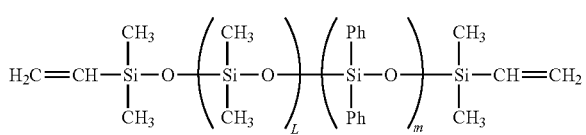

wherein L=35 and m=15, and having a viscosity of 1.5 Pa-s, from which a low-molecular-weight fraction had been removed by alcohol washing, (b) an organohydrogenpolysiloxane having the formula:

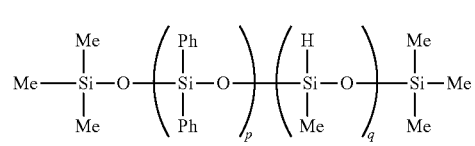

wherein p=1 and q=4, in such an amount as to give 1.2 moles of SiH groups per mole of total silicon-bonded vinyl groups in component (a), and (c) 0.05 part of an octyl alcohol-modified solution of chloroplatinic acid (platinum concentration 2 wt %), and thoroughly mixing. The composition was tested as in Example 1, with the results shown in Table 1 of FIG. 4.

The organopolysiloxane with a low-molecular-weight fraction removal was obtained by an alcohol washing procedure as in Example 1 from a vinylphenylmethylpolysiloxane of the resin structure shown above. For this organopolysiloxane with a low-molecular-weight fraction removed, the content of a low-molecular-weight silicone fraction having a molecular weight of up to 1,000 as measured by GPC versus polystyrene standards was 5%. The extract having a molecular weight of up to 1,000 (low-molecular-weight silicone fraction) extracted from the cured product with acetone was 4.8% by weight based on the cured product.

Example 3

A silicone resin composition was prepared by combining (a) 100 parts of an organopolysiloxane having the formula:

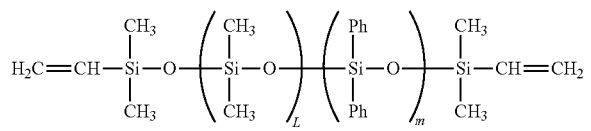

wherein L=20 and m=10, and having a viscosity of 0.7 Pa·s, from which a low-molecular-weight fraction had been removed by alcohol washing, (b) an organohydrogenpolysiloxane having the formula:

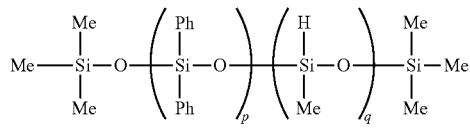

wherein p=1 and q=4, in such an amount as to give 0.7 mole of SiH groups per mole of total silicon-bonded vinyl groups in component (a), and (c) 0.05 part of an octyl alcohol-modified solution of chloroplatinic acid (platinum concentration 2 wt %), and thoroughly mixing. The composition was tested as in Example 1, with the results shown in Table 1 of FIG. 4.

The organopolysiloxane with a low-molecular-weight fraction removal was obtained by an alcohol washing procedure as in Example 1 from a vinylphenylmethylpolysiloxane of the resin structure shown above. For this organopolysiloxane with a low-molecular-weight fraction removed, the content of a low-molecular-weight silicone fraction having a molecular weight of up to 1,000 as measured by GPC versus polystyrene standards was 4%. The extract having a molecular weight of up to 1,000 (low-molecular-weight silicone fraction) extracted from the cured product with acetone was 4.0% by weight based on the cured product.

Comparative Example 1

A silicone resin composition was prepared as in Example 1 except that an organopolysiloxane without a low-molecular-weight fraction removed was used as component (a). The composition was tested as in Example 1, with the results shown in Table 2 of FIG. 4.

For the organopolysiloxane without a low-molecular-weight fraction removed, the content of a low-molecular-weight silicone fraction having a molecular weight of up to 1,000 as measured by GPC versus polystyrene standards was 20%. The extract having a molecular weight of up to 1,000 (low-molecular-weight silicone fraction) extracted from the cured product with acetone was 22.4% by weight based on the cured product.

Comparative Example 2

A silicone resin composition was prepared as in Example 2 except that an organopolysiloxane without a low-molecular-weight fraction removed was used as component (a). The composition was tested as in Example 1, with the results shown in Table 2 of FIG. 4.

For the organopolysiloxane without a low-molecular-weight fraction removed, the content of a low-molecular-weight silicone fraction having a molecular weight of up to 1,000 as measured by GPC versus polystyrene standards was 21%. The extract having a molecular weight of up to 1,000 (low-molecular-weight silicone fraction) extracted from the cured product with acetone was 22.0% by weight based on the cured product.

Comparative Example 3

A silicone resin composition was prepared as in Example 3 except that an organopolysiloxane without a low-molecular-weight fraction removed was used as component (a). The composition was tested as in Example 1, with the results shown in Table 2 of FIG. 4.

For the organopolysiloxane without a low-molecular-weight fraction removed, the content of a low-molecular-weight silicone fraction having a molecular weight of up to 1,000 as measured by GPC versus polystyrene standards was 20%. The extract having a molecular weight of up to 1,000 (low-molecular-weight silicone fraction) extracted from the cured product with acetone was 20.5% by weight based on the cured product.

Comparative Example 4

A light-emitting semiconductor device was encapsulated with a high hardness silicone KJR-632 (Shin-Etsu Chemical Co., Ltd.). The curing conditions included 40° C./24 hr+80° C./2 hr+100° C./2 hr+120° C./2 hr+150° C./4 hr. The sample as cured at 150° C. was subjected to a lighting test as in Example 1 directly (without slow cooling). The sample cracked when it was slowly cooled. In the lighting test, the phenomenon that the luminance lowered at an early stage due to discoloration as observed in comparative Examples 1 to 3 whereas for Examples 1 to 3, discoloration was not observed.

Advantageously, as illustrated by the above examples, the silicon resin compositions prepared in accordance with embodiments of the invention, when applied to the LED device, formed a protective coating of high refractive index that was not subject to delamination or cracking under stress conditions. The light intensity only reduced by 10-15% over two hours, in contrast to comparative examples using silicon resin compositions in which the low molecular weight siloxane fraction was not reduced.

While specific embodiments of the invention have been described and illustrated, such embodiments should be considered illustrative of the invention only and not as limiting the invention as construed in accordance with the accompanying claims.

What is claimed is:

1. An optoelectronic device comprising:
    a light transmitting surface of a light emitting diode (LED); and
    a light transmitting protective coating of cured silicone resin on said light transmitting surface, said protective coating comprising less than about 10% of organosiloxanes having molecular weights of up to about 1000, wherein the silicone resin is formed by the process comprising:
        admixing a linear organopolysiloxane, an organohydrogenpolysiloxane, a substance having at least one of a phenyl and a cyclohexyl group to increase a refractive index of said cured silicone resin to at least about 1.45, and an adhesive aid for enhancing adhesion of said silicone resin to the light transmitting surface; and
        removing at least a portion of the organosiloxanes having molecular weights below 1000 from said linear organopolysiloxane prior to admixing to reduce discoloration of the silicone resin for improved light transmission through the silicone resin.

2. The device of claim 1 further comprising an overcoat layer on said protective coating, said overcoat layer being operable to seal said protective coating.

3. The device of claim 1 wherein said protective coating comprises cured silicone resin having a Shore 00 hardness of up to about 85.

4. The device of claim 1 wherein said substance having at least one of a phenyl and a cyclohexyl group in a proportion of at least about 10% by mole fraction.

5. The device of claim 1 wherein said protective coating comprise at least one of:
    a phosphor material;
    an inorganic filler material; and
    an anti-oxidant operable to prevent discoloration of said protective coating.

6. The device of claim 1 further comprising an optical element spaced apart from said light transmitting surface, and wherein said light protective coating is disposed between said light transmitting surface and said optical element.

7. The device of claim 1 wherein said protective coating comprises less than about 8% of organosiloxanes having molecular weights of up to about 1000.

8. A process for coating a light transmitting surface of a light emitting diode (LED), the process comprising:
    providing the LED on a support structure such that electrical contacts on the LED are bonded to electrical contacts on the support structure;
    providing components containing organosiloxanes, a substance having at least one of a phenyl and a cyclohexyl group to increase a refractive index of a resulting silicon resin to at least about 1.45, and an adhesive aid for admixing to form the-silicone resin, the adhesion aid for enhancing adhesion of said silicone resin to said light transmitting surface;
    removing at least a portion of the organosiloxanes having molecular weights below 1000 from at least one of said components prior to admixing to reduce discoloration of the silicone resin for improved light transmission through the silicone resin;
    admixing the components to form the silicone resin;
    applying a silicone resin to the light transmitting surface after the electrical contacts on the LED are connected to electrical contacts on the support structure; and
    causing said silicone resin to cure to form a light transmitting protective coating on the light transmitting surface, said silicone resin having a sufficiently low proportion of organosiloxanes having molecular weights of up to about 1000, such that said protective coating comprises less than about 10% of said organosiloxanes having molecular weights of up to about 1000.

9. The process of claim 8 wherein admixing the components comprises admixing:
    a linear organopolysiloxane comprising at least one unsaturated aliphatic group participating in hydrosilylation reaction in a molecule;
    an organohydrogenpolysiloxane; and
    a platinum metal catalyst.

10. The process of claim 9 wherein admixing said organohydrogenpolysiloxane comprises admixing an organohydrogenpolysiloxane in sufficient proportion to cause said silicone resin composition to cure to form a protective coating having a Shore 00 hardness of up to about 85.

11. The process of claim 9 wherein admixing said linear organopolysiloxane comprises admixing a linear organopolysiloxane having a viscosity of about 0.3 to about 100 Pa-s at 23° C.

12. The process of claim 9 wherein admixing said linear organopolysiloxane comprises admixing a linear organopolysiloxane having at least one of a phenyl and a cyclohexyl group.

13. The process of claim 9 wherein said linear organopolysiloxane comprises an organopolysiloxane having the general formula:

$$H_2C=HC-\underset{R^1}{\overset{R^1}{\underset{|}{\overset{|}{Si}}}}-O-\left(\underset{R^2}{\overset{R^2}{\underset{|}{\overset{|}{Si}}}}-O\right)_L\left(\underset{R^3}{\overset{R^1}{\underset{|}{\overset{|}{Si}}}}-O\right)_m\underset{R^1}{\overset{R^1}{\underset{|}{\overset{|}{Si}}}}-CH=CH_2$$

wherein $R^1$ are each independently a substituted or unsubstituted monovalent hydrocarbon group, $R^2$ are each independently a substituted or unsubstituted monovalent hydrocarbon group excluding phenyl and cyclohexyl groups; each $R^3$ are each independently a phenyl or cyclohexyl group, each of L and m is 0 or a positive integer, with the proviso that at least one $R^1$ is a phenyl or a cyclohexyl group when m=0, and the sum of L+m is such a number that the organopolysiloxane has a viscosity of about 0.3 to about 100 Pa-s at 23° C.

14. The process of claim 9 wherein removing at least a portion of the organosiloxanes comprises removing at least a portion of organosiloxanes having low molecular weights from said linear organopolysiloxane prior to said admixing.

15. The process of claim 14 wherein said removing comprises at least one of alcohol washing and heating said linear organopolysiloxane.

16. The process of claim 9 wherein admixing further comprises admixing at least one of:
    a phosphor material;
    an inorganic filler material;
    an anti-oxidant operable to prevent discoloration of said protective coating; and
    a cure inhibitor operable to inhibit curing of the silicone resin after said admixing.

17. The process of claim 8 further comprising overcoating said protective coating with a sealing material.

18. The process of claim 8 wherein applying said silicone resin comprises applying a silicone resin having a sufficiently low proportion of organosiloxanes having molecular weights of up to about 1000, such that said protective coating comprises less than about 8% of said organosiloxanes having molecular weights of up to about 1000.

19. A silicone resin composition coating a light transmitting surface of an optoelectronic device, the composition comprising:
- a plurality of liquid components including:
  - a linear organopolysiloxane component comprising at least one unsaturated aliphatic group participating in hydrosilylation reaction in a molecule;
  - an organohydrogenpolysiloxane component;
  - a platinum metal catalyst;
  - a substance having at least one of a phenyl and a cyclohexyl group to increase a refractive index of said silicone resin to at least about 1.45, and
  - an adhesive aid for enhancing adhesion of said silicone resin to the light transmitting surface,
- wherein at least a portion of organosiloxanes having molecular weights below 1000 are removed from said linear organopolysiloxane component prior to admixing the components to reduce discoloration of the silicone resin for improved light transmission through the silicone resin,
- said linear organopolysiloxane component having a sufficiently low proportion of organosiloxanes having molecular weights of up to about 1000, such that when said silicone resin product is cured said cured product comprises less than about 10% of said organosiloxanes having molecular weights of up to about 1000.

20. The silicone resin composition of claim 19 wherein said liquid components are admixed with a cure inhibitor operable to inhibit curing of the silicone resin product prior to application on the light transmitting surface.

21. The silicone resin composition of claim 19 wherein said liquid components are provided separately for combination into said silicone resin composition immediately prior to application on the light transmitting surface.

22. The silicone resin composition of claim 19 further comprising at least one of:
- a phosphor material;
- an inorganic filler material; and
- an anti-oxidant operable to prevent discoloration of said cured product.

23. The silicone resin composition of claim 19 wherein said linear organopolysiloxane component has a sufficiently low proportion of organosiloxanes having molecular weights of up to about 1000, such that when said silicone resin product is cured said cured product comprises less than about 8% of said organosiloxanes having molecular weights of up to about 1000.

* * * * *